United States Patent [19]

Enomoto et al.

[11] 4,388,755

[45] Jun. 21, 1983

[54] STRUCTURE FOR AND METHOD OF MANUFACTURING A SEMICONDUCTOR DEVICE BY THE MASTER SLICE METHOD

[75] Inventors: Hiromu Enomoto, Kawasaki; Yasushi Yasuda, Inagi; Yoshiharu Mitono, Tokyo; Taketo Imaizumi, Fukuoka; Hitoshi Ohmichi, Kawasaki, all of Japan

[73] Assignee: Fujitsu Limited, Kawasaki, Japan

[21] Appl. No.: 207,737

[22] Filed: Nov. 17, 1980

[30] Foreign Application Priority Data

Nov. 20, 1979 [JP] Japan .................................. 54-150307

[51] Int. Cl.³ .............................................. H01L 27/04
[52] U.S. Cl. ................................. 29/577 C; 29/577 R; 29/571; 29/576 R
[58] Field of Search ................ 29/577 IC, 577 R, 571, 29/576 R; 357/36, 28, 43

[56] References Cited

U.S. PATENT DOCUMENTS 3,747,088  7/1973  Pastoriza ............................ 357/36 X
3,884,732  5/1975  Baitinger ........................... 148/187 X
3,995,304  11/1976  Pease ..................................... 357/36

Primary Examiner—L. Dewayne Rutledge
Assistant Examiner—David Hey
Attorney, Agent, or Firm—Staas & Halsey

[57] ABSTRACT

A structure and method for manufacturing semiconductor devices by the master slice method, in which various kinds of semiconductor devices are manufactured through utilization of a common master pattern and a plurality of different kinds of selective wiring patterns. A number of bipolar transistors each having plural emitter regions, is formed in a predetermined region, or portion, of a semiconductor substrate by employing a common master pattern, and the plural emitter regions of the respective bipolar transistors are selectively connected by the associated wiring patterns of each thereof to form corresponding bipolar transistors of different, predetermined D.C. characteristics. When manufacturing many different kinds of semiconductor devices by the master slice method, the area which would be wasted on the semiconductor substrate by prior art techniques is greatly reduced, thus providing for enhanced area efficiency.

5 Claims, 13 Drawing Figures

STRUCTURE FOR AND METHOD OF MANUFACTURING A SEMICONDUCTOR DEVICE BY THE MASTER SLICE METHOD

BACKGROUND OF THE INVENTION

1. Field of the Invention

The present invention relates to a method for manufacturing a semiconductor device and, more particularly, to an improved method for manufacturing integrated circuit devices including bipolar transistors by the master slice method.

2. Description of the Prior Art

The master slice method, which is one of the methods for manufacturing LSI or like semiconductor devices, is a method which employs a common master pattern in the manufacturing process, from a starting step to a diffusion one, to form transistors, resistors and other elements in a substrate and wherein the circuit elements are wired in a particular pattern selected in accordance with a semiconductor device desired ultimately to be obtained. With such a master slice method, in the case of producing LSI's, especially in the case of manufacturing many kinds of LSI's in small quantities of each kind, the manufacturing costs and times can be reduced since one part of the manufacturing process is common to all of them.

Generally, in the formation of circuits, it is often required to provide a predetermined current ratio between a plurality of semiconductor elements.

Figure 1:
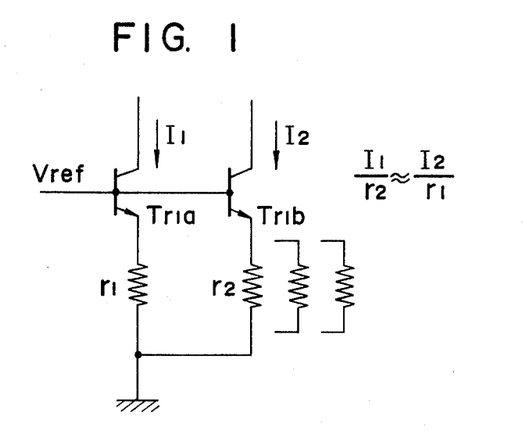
FIG. 1 is a circuit diagram explanatory of a prior art example of a bipolar transistor structure adapted for a master slice method of manufacture.

For obtaining a predetermined current ratio through utilization of semiconductor elements of the same characteristics to meet such a requirement, it is considered possible to connect resistors r1 and r2 of different values to transistors Tr1a And Tr1b respectively, as shown in FIG. 1. Letting the currents flowing in the transistors Tr1a and Tr1b be represented by I1 and I2, respectively, there exists a relationship, $I1/r2 \approx I2/r1$.

In the case where the predetermined current ratio is intended to be obtained by changing the currents flowing in the transistors Tr1a and Tr1b of the same characteristics by using the resistors, as described above, however, the emitter current density of each transistor varies, so that the transistor Tr1a or Tr1b operates at a point different from its normal operating point and the temperature dependency of their respective base-to-emitter voltages VBE differ from each other, resulting in the preset current ratio varying with temperature.

Figure 2:
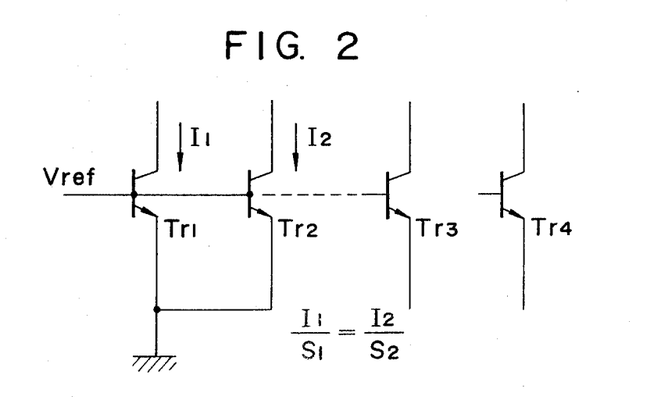
FIG. 2 is a circuit diagram explanatory of another prior art example, relative to that of FIG. 1.

A remedy for such a defect is to employ transistors of different emitter areas. Assuming that transistors Tr1, Tr2, Tr3, Tr4, ... shown in FIG. 2 have different emitter areas S1, S2, S3, S4, ..., respectively, it follows that $I1/S1 = I2/S2$. In such a case, it is possible to provide a required current ratio between adjacent ones of the transistors and to retain the emitter current density of each transistor constant; accordingly, the transistors operate in their normal mode of operation and do not suffer characteristic variations due to temperature.

Now, a description will be given of the method for manufacturing an integrated circuit device including such transistors of different emitter areas according to the master slice method. For facilitating a better understanding of the description, the following will describe the case in which three kinds of LSI's (semiconductor devices), each formed by 10 transistors of one of three kinds of bipolar transistors Tr1, Tr2 and Tr3 whose emitter areas are in the ratio of 1 to 2 to 3, are manufactured by the master slice method. With their emitter areas selected in the ratio of 1 to 2 to 3, the bipolar transistors exhibit different characteristics, for example, in that their collector voltage ratio relative to the same base-emitter voltage $V_{BE}$ is 1 to 2 to 3.

Figure 3:
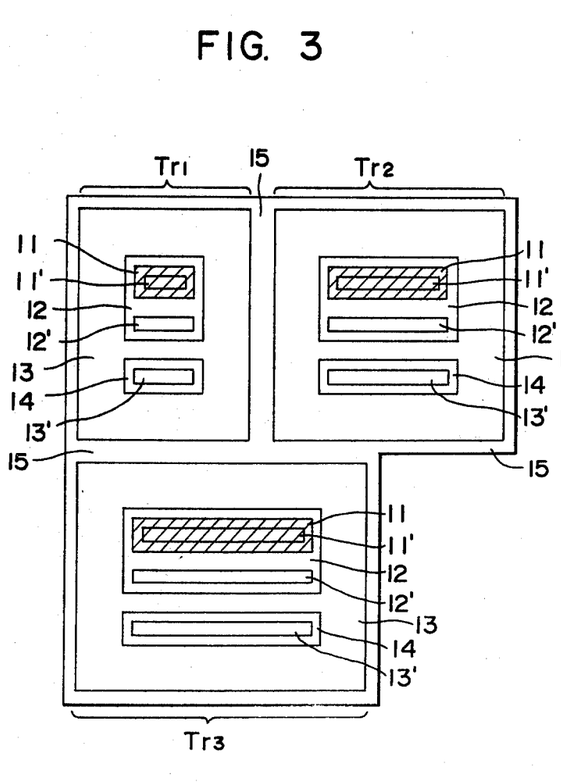
FIG. 3 is a plan view illustrating the principal components and relative size relationships of three different kinds of transistors as employed in a semiconductor device produced according to the prior art.
Figure 4A:
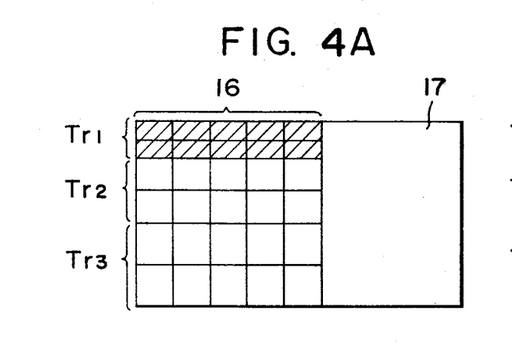
FIGS. 4(A), (B) and (C) are plan views of master patterns for semiconductor devices employing groups of each of the different kinds of transistors as shown in FIG. 3.
Figure 4B:
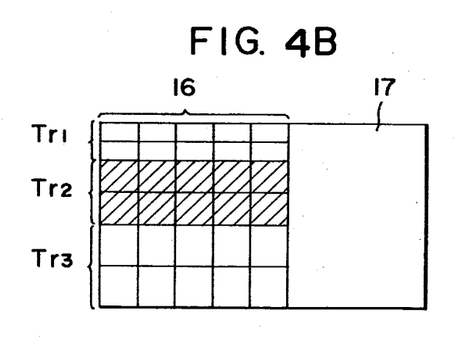
Figure 4C:
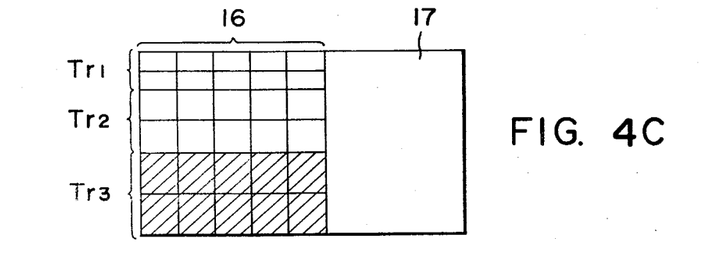

With the master slice method, the same master pattern is used for a plurality of different kinds of LSI's, but in the case of this example, it is necessary to prepare a master pattern including 10 transistors of each of the three kinds of bipolar transistors Tr1, Tr2 and Tr3. FIG. 3 shows a pattern of each of the three kinds of bipolar transistors Tr1, Tr2 and Tr3. In FIG. 3, the hatched parts are their emitter regions 11 and the areas of the emitter regions of the bipolar transistors Tr1, Tr2 and Tr3 are selected in the ratio of 1 to 2 to 3. The respective reference numerals 12 indicate base regions; 13 designate collector regions; 14 identify collector contact regions; 11', 12' and 13' denote contact holes, or windows for the respective regions; and 15 represents an isolation region for isolating each of the transistors from the others. FIGS. 4A to 4C are explanatory of this example, schematically illustrating master patterns. In FIGS. 4(A), (B) and (C), each part indicated by reference numeral 16 is a region in which are prepared ten (10) of each of the three kinds of bipolar transistors Tr1, Tr2 and Tr3. Each part indicated by reference numeral 17 is a region prepared and reserved for elements which perform other functions than those of the bipolar transistors Tr1, Tr2, Tr3. Each hatched portion of the regions 16 identifies the bipolar transistors Tr1, Tr2, or Tr3 which are interconnected in a subsequent wiring step and put to practical use. In FIG. 4(a), ten (10) bipolar transistors Tr1 are used, and in FIGS. 4(b) and (c) ten (10) bipolar transistors Tr2 and Tr3 are similarly used, respectively.

As will be seen from FIGS. 4A to 4C, although in this example each of the three kinds of bipolar transistors Tr1, Tr2 and Tr3 are prepared in groups of 10s, only some of them are actually used, leaving the others unused.

SUMMARY OF THE INVENTION

In view of the above-said defect of the prior art, an object of the present invention is to provide a method for the manufacture of semiconductor devices according to which when providing a region for the formation of bipolar transistors of different characteristics in a common master pattern, the ratio of the overall region of the bipolar transistors to be actually used to the region provided therefor is increased, thereby reducing the relative extent of unused regions in the master pattern and improving its area efficiency.

Briefly stated, the present invention relates to a method for manufacturing a semiconductor device in which various kinds of semiconductor devices, in each of which a predetermined DC characteristic is set up among a plurality of bipolar transistors and the emitter current densities of the bipolar transistors are held substantially the same, are manufactured by the master slice method through utilization of a common master pattern and required kinds of wiring patterns. More particularly, in accordance with the present invention, a number of bipolar transistor portions having, respectively, a plurality of emitter regions are formed by the common master pattern in a semiconductor substrate, and bipolar transistors of different DC characteristics then are formed by the wiring patterns, which are designed to selectively connect together the number of emitter regions required for each particular semiconductor device to achieve the desired DC characteristics thereof while maintaining substantially common emitter current density of each for the different, required emitter current levels thereof.

BRIEF DESCRIPTION OF THE DRAWINGS

FIGS. 8 (A), (B) and (C) are plan views of bipolar transistor structure portions of three different semiconductor devices produced and selectively wired according to the present invention to provide desired, relative current ratios therebetween.

DESCRIPTION OF THE PREFERRED EMBODIMENTS

Figure 5:
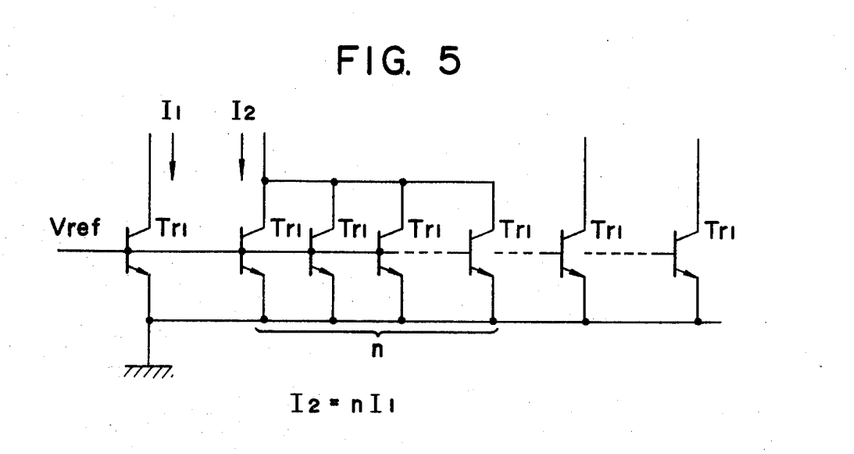
FIG. 5 is a circuit diagram explanatory of the present invention.

The original or basic idea of the present invention is that plural transistors Tr1 of the same emitter area and the same characteristics are prepared and selectively connected in parallel in accordance with a required current ratio, as shown in FIG. 5. Letting the number of transistors Tr1 connected in parallel be represented by n, I2=nI1.

With such an arrangement, the area efficiency is excellent, as compared with the area efficiency obtainable with the prior art examples described previously in respect of FIGS. 3 and 4.

Figure 6:
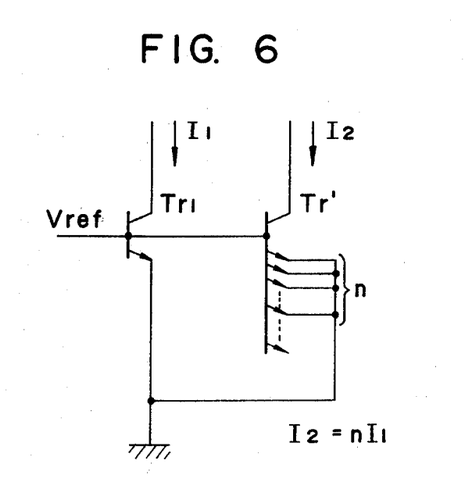
FIG. 6 is an equivalent circuit diagram of the bipolar transistor structure portion of a semiconductor device produced according to the present invention.

In this case, however, the highest area efficiency can be obtained by employing, as a transistor Tr', a multi-emitter transistor having a plurality of emitters of the same area and connecting the emitters in parallel as required, as shown in FIG. 6. It is the fundamental idea of the present invention that semiconductor devices including such a transistor as shown in FIG. 6 are produced by the master slice method. In FIG. 6, letting the number of emitters connected in parallel be represented by n, I2=nI1.

A detailed description will hereinafter be given, with reference to FIG. 7 et seq. of an embodiment of the present invention. For a better understanding the present invention, the invention will be described as being applied to the same example as that described previously in connection with the prior art.

Figure 7:
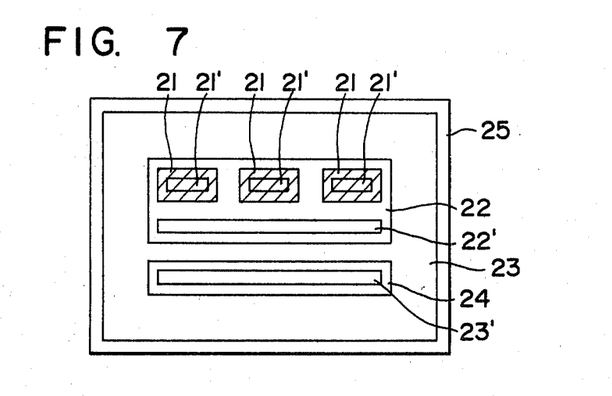
FIG. 7 is a plan view of the bipolar transistor structure portion of a semiconductor device produced according to the present invention.
Figure 8A:
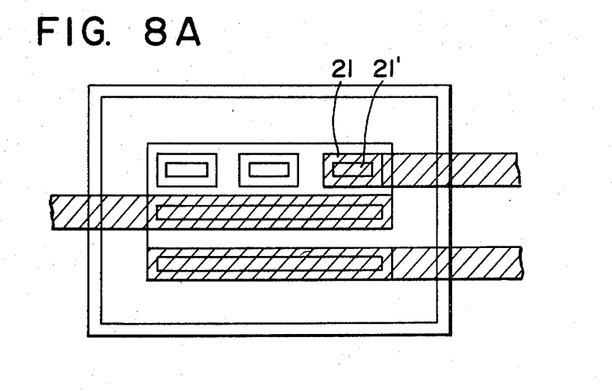
Figure 8B:
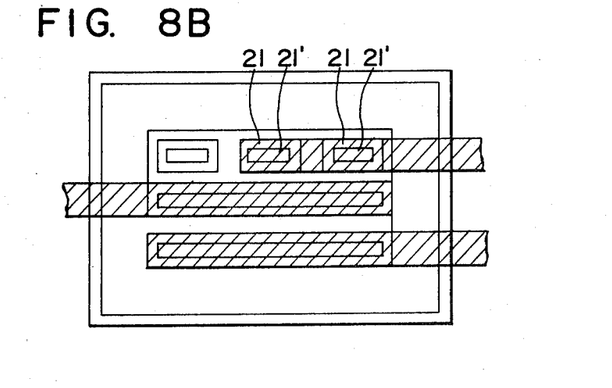
Figure 8C:
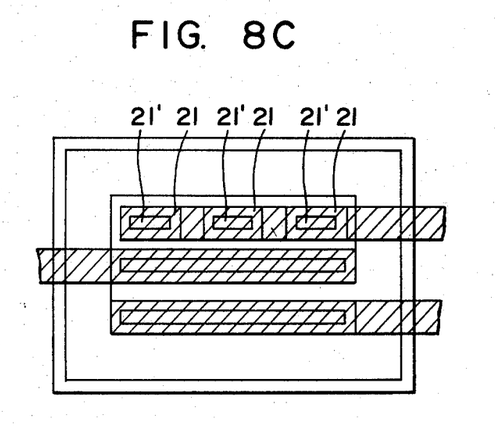

According to the present embodiment, for obtaining three kinds of bipolar transistors which have an emitter area ratio of 1 to 2 to 3, use is made of a bipolar transistor of such a pattern as shown in FIG. 7. In FIG. 7, reference numerals 21 indicate emitter regions (hatched portions), each of which has the same area as the emitter region 11 of the bipolar transistor Tr1 shown in FIG. 3, three such emitter regions 21 being provided in all; 22 designates a base region; 23 identifies a collector region; 24 denotes a collector contact region; 21', 22' and 23' represent contact holes, or windows for the respective regions 21, 22 and 23; and 25 identifies an isolation region. FIGS. 8 (A), (B) and (C) respectively illustrate bipolar transistors bearing an emitter area ratio of 1 to 2 to 3, produced by employing different patterns for selectively and differently wiring bipolar transistors each formed in the pattern of FIG. 7. The hatching indicates the selective wiring patterns in each instance. In FIG. 8(A), one emitter region 21 is used and in FIGS. 8(B) and (C), two and three emitter regions 21 are used respectively. The area occupied by each of the individual bipolar transistors of FIGS. 7 and 8(A) to 8(C) is larger than the area occupied by any of the bipolar transistors Tr1, Tr2 and Tr3 of FIG. 3, but is smaller than the sum of the individual areas occupied by the three bipolar transistors Tr1, Tr2 and Tr3 (about one-half in this embodiment).

Figure 9:
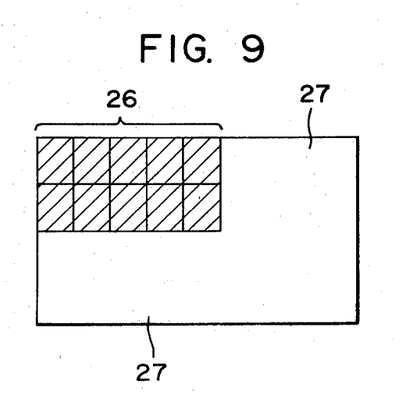
FIG. 9 is a plan view illustrating the portion of a semiconductor device required for bipolar transistor structures formed in accordance with the invention, and demonstrating the fact that the area efficiency of a semiconductor device produced according to the present invention is high.

When groups of three kinds of LSI's, which are respectively formed by the three kinds of transistors Tr1, Tr2 and Tr3, are manufactured in accordance with the present embodiment, the bipolar transistors are formed as shown in FIG. 9. In other words, according to the present embodiment, since plural kinds of bipolar transistors can be obtained with the same basic pattern as shown in FIG. 7, it is sufficient to provide in the master pattern ten (10) such bipolar transistors in accordance with the present invention as depicted in FIG. 7; accordingly the area of, the region, or portion, of the semiconductor device required for the ten (10) bipolar transistors is smaller than the region needed in the prior art (about one-half in this embodiment). In FIG. 9, reference numeral 26 indicates the region for the bipolar transistors, which are actually used; and 27 designates the other, remaining region of the semiconductor device available for the formation of other components performing other functions.

As has been described in the foregoing, according to the present invention, a plurality of kinds of bipolar transistors of different characteristics can be obtained by employing different selectively wiring patterns for wiring the bipolar transistors formed by a common master pattern. Accordingly, in the manufacture of a plurality of kinds of semiconductor devices (such as LSI's) having bipolar transistors of different characteristics by the master slice method using a common master pattern, the region or portion of the total area of a semiconductor device prepared in the master pattern for the formation of the bipolar transistors is reduced as compared with the region needed in the prior art; hence, it is possible to produce semiconductor devices of excellent area efficiency.

It will be apparent that many modifications and variations may be effected without departing from the scope of the novel concepts of this invention.

What is claimed is:

1. A master slice method for forming semiconductor devices of selectively different kinds, each such device comprising a predetermined plurality of bipolar transistors respectively having common, predetermined DC characteristics and substantially similar, desired values of emitter current densities, comprising:

providing a semiconductor substrate of predetermined area for each such semiconductor device,     employing a common master pattern to form said predetermined plurality of bipolar transistors in a predetermined portion of said area of said semiconductor substrate provided for each said semiconductor device, including forming for each said bipolar transistor in accordance with said common master pattern, a collector region, a base region, and a predetermined plurality of emitter regions formed in said base region, and     the DC characteristics of a given such semiconductor device being determined in accordance with the number of emitter regions, out of said predetermined plurality thereof, selectively connected together to form, collectively, the active emitter region of each such bipolar transistor of each said semiconductor device.

2. A master slice method as recited in claim 1, further comprising:

forming a wiring pattern for each said semiconductor device for selectively connecting together said number of emitter regions, out of said plurality thereof, of each said bipolar transistor of said semiconductor device in accordance with the predetermined DC characteristics thereof for maintaining said desired value of emitter current density for a required emitter current level of each said respective bipolar transistor of each said semiconductor device.

3. A master slice method as recited in claims 1 or 2, further comprising defining, in accordance with said master pattern, a contact window to permit electrical connection to each of said collector region and said base region, and to each of said emitter regions of each said bipolar transistor.

4. A master slice method as recited in claims 1 or 2 further comprising forming, in accordance with said master pattern, emitter regions of substantially the same size for each said bipolar transistor of each said semiconductor device.

5. A method as recited in claim 1 or 2 further comprising: selectively electrically connecting together said desired emitter regions of each said bipolar transistor in a common emitter configuration for the said bipolar transistor.

* * * * *

UNITED STATES PATENT AND TRADEMARK OFFICE
CERTIFICATE OF CORRECTION

PATENT NO. : 4,388,755

DATED : June 21, 1983

INVENTOR(S) : Enomoto et al.

It is certified that error appears in the above-identified patent and that said Letters Patent is hereby corrected as shown below:

Front page, [57] ABSTRACT, line 6, after "transistors" insert --,--;

(Line numbering off in column 2)

Col. 2, line 18, after "windows" insert --,--;

line 31, "4(a)" should be --4(A)--;

line 32, "4(b)" should be --4(B)--;

line 33, "(c)" should be --(C)--;

line 33, after "(c)" insert --,--;

line 46, after "which" insert --,--;

Col. 3, line 44, "original or basic" should be --original, or basic,--;

line 67, after "understanding" insert --of--;

line 68, delete "a";

Col. 4, line 1, "pplied" should be --applied--;

line 13, after "windows" insert --,--;

UNITED STATES PATENT AND TRADEMARK OFFICE
CERTIFICATE OF CORRECTION

PATENT NO. : 4,388,755  Page 2 of 2
DATED : June 21, 1983
INVENTOR(S) : Enomoto et al.

It is certified that error appears in the above-identified patent and that said Letters Patent is hereby corrected as shown below:

line 18, "and differently" should be --, and differently,--;

line 22, after "used" insert --,--;

line 40, "the area of," should be --, the area of--;

line 52, delete "selectively";

line 52, after "for" insert --selectively--.

Signed and Sealed this

Twenty-fourth Day of January 1984

[SEAL]

Attest:

GERALD J. MOSSINGHOFF

*Attesting Officer*     *Commissioner of Patents and Trademarks*